United States Patent
Baruch et al.

(10) Patent No.: US 9,459,297 B2
(45) Date of Patent: Oct. 4, 2016

(54) ON-DIE CAPACITANCE MEASUREMENT MODULE AND METHOD FOR MEASURING AN ON-DIE CAPACITIVE LOAD

(75) Inventors: Ezra Baruch, Karkur (IL); Rinatya Levy, Hertzelia (IL); Shai Shperber, Bat Hefer (IL)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 261 days.

(21) Appl. No.: 14/371,639

(22) PCT Filed: Jan. 20, 2012

(86) PCT No.: PCT/IB2012/050283
§ 371 (c)(1),
(2), (4) Date: Jul. 10, 2014

(87) PCT Pub. No.: WO2013/108082
PCT Pub. Date: Jul. 25, 2013

(65) Prior Publication Data
US 2014/0333327 A1   Nov. 13, 2014

(51) Int. Cl.
*G01R 27/26* (2006.01)
*G01R 31/28* (2006.01)
(Continued)

(52) U.S. Cl.
CPC ....... *G01R 27/2605* (2013.01); *G01R 31/2648* (2013.01); *G01R 31/2834* (2013.01); *G01R 31/2882* (2013.01); *H01L 22/34* (2013.01)

(58) Field of Classification Search
CPC ........ G01R 27/26; G01R 31/28; H03K 3/03; G06F 19/00
USPC ........................................................ 324/658
See application file for complete search history.

(56) References Cited

U.S. PATENT DOCUMENTS 5,999,010 A   12/1999   Arora et al.
6,366,098 B1   4/2002   Froment
(Continued)

FOREIGN PATENT DOCUMENTS

KR   10-2011-0087186 A   8/2011

OTHER PUBLICATIONS

Michael Sotman et al, "On-Die Decoupling Capacitance", IEEE ISCAS 2006, pp. 489-492, May 21, 2006.
(Continued)

*Primary Examiner* — Tung X Nguyen
*Assistant Examiner* — Zannatul Ferdous

(57) ABSTRACT

An on-die capacitance measurement module (ODCMM) arranged to measure a capacitance element. The ODCMM comprises an oscillating voltage supply that outputs first and second oscillating voltage signals, the first and second oscillating voltage signals comprising differing phases, and the oscillating voltage supply component coupled to a first node of the capacitance element and arranged to provide thereto the first oscillating voltage signal, and a reference voltage component coupled to a second node of the capacitance element to provide a reference voltage signal. The ODCMM operates in a first mode, wherein the reference voltage component is arranged to provide a constant reference voltage to the second node of the capacitance element. The ODCMM is arranged to operate in a second mode, wherein the reference voltage component is arranged to provide a reference voltage signal representative of the second oscillating voltage signal output by the oscillating voltage supply component to the second node of the capacitance element.

14 Claims, 4 Drawing Sheets

(51) Int. Cl.
*G01R 31/26* (2014.01)
*H01L 21/66* (2006.01)

(56) References Cited

U.S. PATENT DOCUMENTS

| | | | |
|---|---|---|---|
| 7,486,086 | B2 | 2/2009 | Chang et al. |
| 7,777,503 | B2 | 8/2010 | Reynolds |
| 8,154,309 | B2 * | 4/2012 | Agarwal ................ G01R 31/27 324/658 |
| 2005/0088186 | A1 | 4/2005 | Maciejewski et al. |
| 2006/0273804 | A1 | 12/2006 | Delorme et al. |
| 2007/0046383 | A1 * | 3/2007 | Bhushan ............ G01R 31/2824 331/57 |
| 2009/0189619 | A1 | 7/2009 | Stevenson et al. |

OTHER PUBLICATIONS

Chang Yao-Wen et al, "A Novel Simple CBCM Method Free From Charge Injection-Induced Errors", IEEE Electron Device Letters, vol. 25, No. 5, May 2004, pp. 262-264.

Baruch, Ezra et al, "A Simple System for on-die Measurement of atto-Farad Capacitance", 2011 IEEE Conference on Microelectronic Test Structures, Apr. 4-7, Amsterdam, The Netherlands, pp. 19-21.

International Search Report and Written Opinion correlating to PCT/IB2012/050283 dated Oct. 10, 2012.

* cited by examiner

ON-DIE CAPACITANCE MEASUREMENT MODULE AND METHOD FOR MEASURING AN ON-DIE CAPACITIVE LOAD

FIELD OF THE INVENTION

This invention relates to an on-die capacitance measurement module and a method for measuring an on-die capacitive load.

BACKGROUND OF THE INVENTION

In the field of semiconductor devices, in order to ensure effective chip design and layout, effective and reliable characterisation of capacitive structures is required. Such capacitive structures may include, by way of example, coupling capacitance between metal lines, gate capacitance of transistors, diode capacitance, capacitive sensor capacitance, etc. In order to achieve such characterisation of capacitance structures, it is known to use test structures, wherein a prototype chip having one or more desired capacitive structures of an integrated circuit (IC) chip to be characterised is manufactured, and the capacitances of the test structures are measured. The capacitance measurement results can then be used to analyze if fabrication of silicon for the desired capacitive structures is within target, for debug of any related issues in the device's circuitry, for readout of a capacitive sensor, etc.

Conventional techniques for measuring the capacitances of the test structures comprise applying voltage pulses to the test structures, and measuring current flow through the test structures. Average current measurements may then be used to calculate the capacitance of the test structures: $C=I/Vf$.

However, the continued advances in semiconductor fabrication processes have lead to increasingly smaller transistor architectures, resulting in increasing sensitivity to on-die capacitances such as parasitic capacitances, coupling capacitances, etc. As such, currents in the range of pico-amps (pAs) and below are required to be measured using conventional techniques in order to enable sufficiently sensitive characterisation of the on-die capacitances. In order to measure such small currents, a Parametric Analyser is required. Standard automated test equipment (ATE) often does not comprise an integrated Parametric Analyser. Even where a parametric analyser is integrated into the available ATE, the use of a Parametric Analyser to enable such accurate current measurements requires numerous averaging techniques, resulting in excessively long measurement times.

SUMMARY OF THE INVENTION

The present invention provides an on-die capacitance measurement module, a method for measuring an on-die capacitive load, and a non-transitory computer program product as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
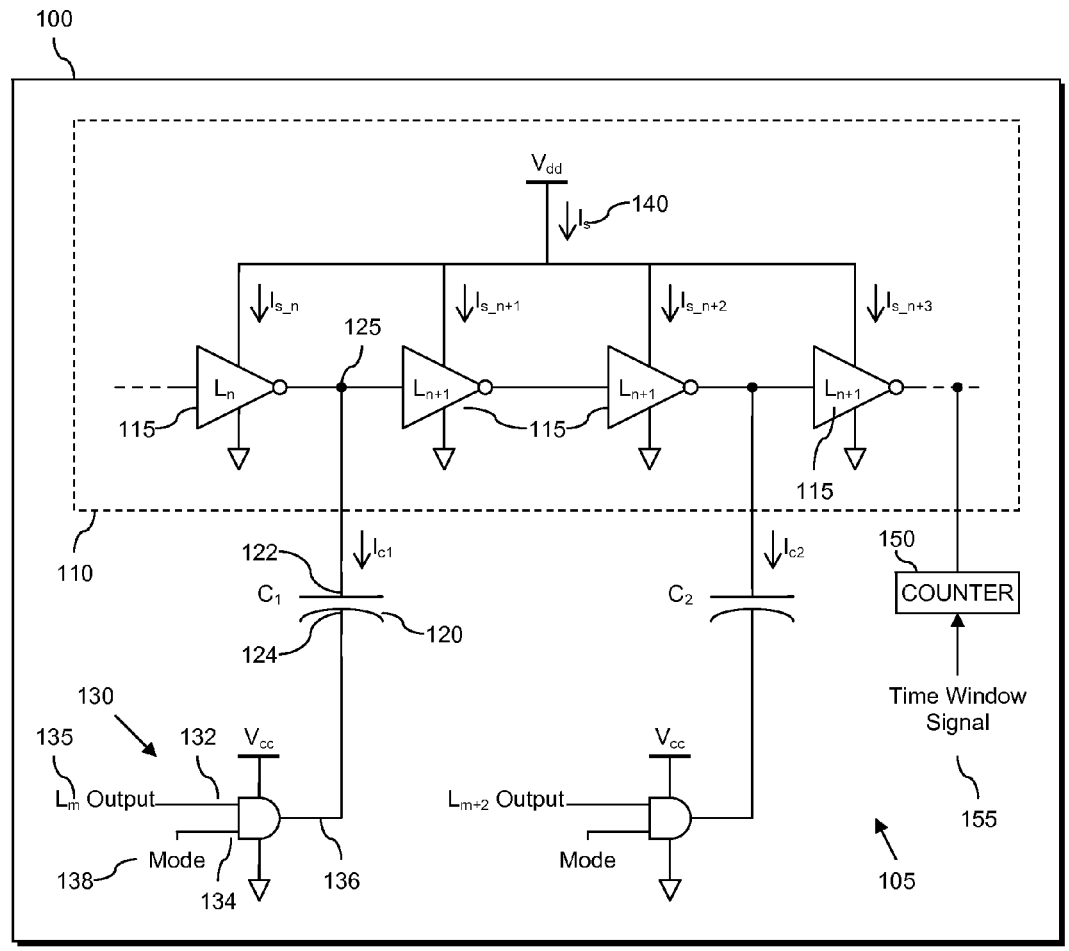
FIG. 1 illustrates a simplified block diagram of an example of an integrated circuit device comprising an on-die capacitance measurement module.

Referring first to FIG. 1, there is illustrated a simplified block diagram of an example of an integrated circuit device 100 comprising an on-die capacitance measurement module 105 arranged to enable measurement of at least one capacitance element. The capacitance measurement module 105 comprises an oscillating voltage supply component, which in the illustrated example comprises a ring oscillator 110. The ring oscillator 110 comprises a plurality of inverter stages 115, and specifically an odd number of inverter stages 115, operably coupled in a ring formation such that an oscillating voltage signal is caused to cycle around the ring of inverter stages 115. In this manner, an oscillating voltage signal is generated at an output of each of the inverter stages 115, with a delay in the propagation of the oscillating signal through each inverter stage 115 creating a phase shift between oscillating voltage signals output by consecutive inverter stages 115. Thus, the inverter stages 115 of the ring oscillator 110 generate at their outputs a plurality of oscillating voltage signals comprising differing phases.

An output 125 of a first inverter stage 115 of the ring oscillator 110 is operably coupled to a first node 122 of a capacitance element 120 to be measured. In this manner, the ring oscillator 110 is arranged to provide a first oscillating voltage signal to the first node 122 of the capacitance element 120.

The on-die capacitance measurement module 105 further comprises at least one reference voltage component 130 operably coupled to a second node 124 of the capacitance element 120 and arranged to provide thereto a reference voltage signal 136. The on-die capacitance measurement module 105 is arranged to operate in a first mode, wherein the reference voltage component 130 is arranged to provide a constant reference voltage to the second node 124 of the capacitance element 120, and to operate in a second mode, wherein the reference voltage component 130 is arranged to provide a reference voltage signal representative of a further oscillating voltage signal output by the ring oscillator 110 to the second node 124 of the capacitance element 120.

In the illustrated example, the reference voltage component 130 comprises combinational logic, and specifically in the illustrated example an AND gate, arranged to receive at a first input 132 thereof the further oscillating voltage signal 135 output by the ring oscillator 110, and at a second input 134 thereof a mode select signal 138, and to output the reference voltage signal 136 to the second node 124 of the capacitance element 130. In this manner, upon the mode select signal 138 being set to a '0' value, the reference voltage component 130 operates in the first mode and outputs a substantially constant '0' reference voltage signal 136; e.g. ties the reference voltage signal 136 to ground. Conversely, upon the mode select signal 138 being set to a '1' value, the reference voltage component 130 operates in the second mode and outputs an oscillating signal representative of the further oscillating voltage signal 135.

Figure 2:
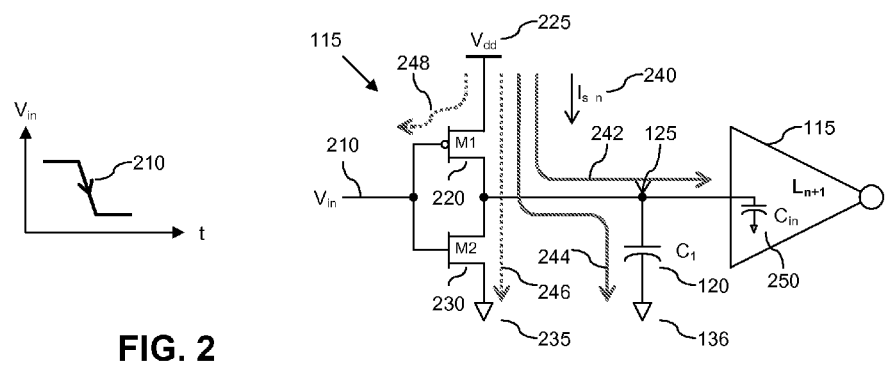
FIGS. 2 and 3 illustrate simplified diagrams of an example of an on-die capacitance measurement module operating in a first mode of operation.
Figure 3:
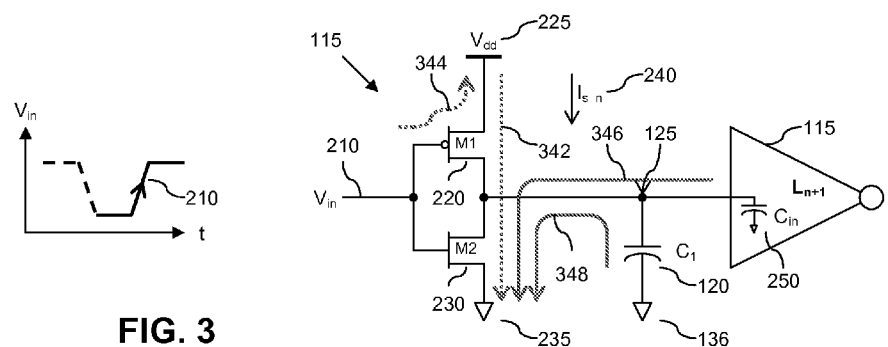
Figure 4:
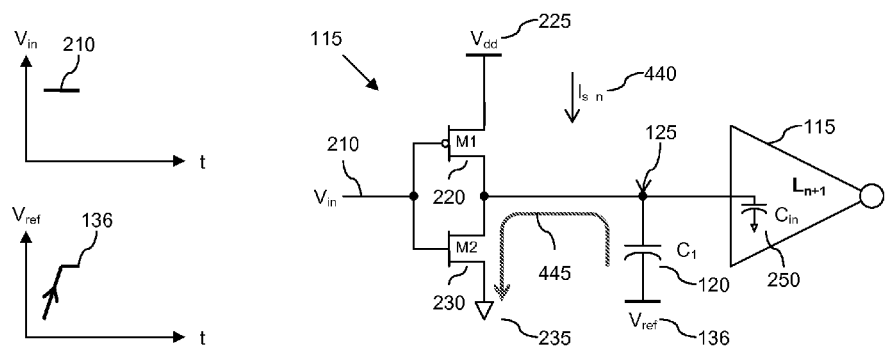
FIGS. 4 to 7 illustrated simplified diagrams of an example of an on-die capacitance measurement module operating in a second mode of operation.

Referring now to FIGS. 2 and 3, there are illustrated simplified diagrams of the on-die capacitance measurement module 105 operating in the first mode of operation. As described above, in this first mode of operation, the reference voltage component 130 is arranged to output a '0' value, for example by tying the reference voltage signal to ground 136, thereby tying the second node 124 (FIG. 1) of the capacitance element 120 to ground as illustrated in FIGS. 2 and 3. The first node 122 (FIG. 1) of the capacitance element 120 is operably coupled to the output 125 of an inverter stage 115, which has been simplistically illustrated at a transistor level in FIGS. 2 and 3 as comprising a first transistor M1 220 arranged to selectively couple the output 125 to a first voltage supply signal $V_{dd}$ 225, and a second transistor M2 230 arranged to selectively couple the output 125 to a second voltage supply signal, for example ground, 235.

An input 210 of this inverter stage 115 is arranged to receive an oscillating signal output by a preceding inverter stage (not shown). When the oscillating input signal 210 switches from a high voltage level to a low voltage level, as illustrated in FIG. 2, the first transistor M1 220 'closes', operably coupling the output 125 to the first voltage supply signal 225, whilst the second transistor M2 230 'opens', substantially isolating the output 125 from the second voltage supply signal 235. In this manner, when the oscillating input signal 210 switches from a high voltage level to a low voltage level, the first node 122 (FIG. 1) of the capacitance element 120 is operably coupled to the first voltage supply signal 225. As such, current 244 flows from the first voltage supply 225 into the first node 122 of the capacitance element 120, charging the capacitance element 120. A current 242 also flows from the first voltage supply signal 225 to various parasitic capacitances connected to the output node 125, such parasitic capacitances being illustrated generally by an input capacitance 250 of a next inverter stage 115 in the oscillator ring 110. In addition, some mid-switching short circuit and leakage current will occur through the transistors 220, 230, illustrated at 246 and 248. Thus, a supply current 240 from the first voltage supply signal 220 will comprise a combination of these charging and leakage currents 242, 244, 246, 248.

Referring now to FIG. 3, when the oscillating input signal 210 switches from a low voltage level to a high voltage level, the first transistor M1 220 'opens', substantially isolating the output 125 from the first voltage supply signal 225, whilst the second transistor M2 230 'closes', operably coupling the output 125 to the second voltage supply signal 235. In this manner, when the oscillating input signal 210 switches from a low voltage level to a high voltage level, the first node 122 (FIG. 1) of the capacitance element 120 is operably coupled to the second voltage supply signal 235, which in the illustrated example comprises ground. As such, current 348 flows from the capacitance element 120 through the second transistor M2 230 to ground 235, discharging the capacitance element 120. Current 346 will also discharge from the input capacitance 250 of a next inverter stage 115 in the oscillator ring 110 to ground 235. In addition, some mid-switching short circuit and leakage current will again occur through the transistors 220, 230, illustrated at 342 and 344. Thus, a supply current 240 from the first voltage supply signal 220 will comprise a combination of the leakage currents 342, 344.

In this manner, when operating in this first mode, the on-die capacitance measurement module 105 is arranged to cyclically charge and discharge the capacitance element 120. Significantly, the supply current 240 to the inverter stage 115 during this first operating mode comprises the charging currents of the capacitive loads 120, 250 in the circuit, as well as the mid-switching short circuit currents during switching and the various of leakage currents.

Referring now to FIGS. 4 to 7, there are illustrated simplified diagrams of the on-die capacitance measurement module 105 operating in the second mode of operation. As described above, in this second mode of operation, the reference voltage component 130 is arranged to output an oscillating signal representative of the further oscillating voltage signal 135. Starting with FIG. 4, the input signal 210 comprises a high voltage level such that transistor M1 220 is open, substantially isolating the output 125 from the first voltage supply signal 225, whilst M2 is closed, operably coupling the output 125 to the second voltage supply signal, ground 225. When the oscillating reference signal 135, which comprises a phase offset relative to the input signal 210, switches from a low voltage level to a high voltage level, the potential difference across the capacitance element 120 changes from being substantially zero, to being negative (i.e. the second node 124 (FIG. 1) of the capacitance element 120 comprising a higher voltage level than the first node 122 (FIG. 1) due to the high voltage level of the reference voltage 135). Accordingly, a current 445 is caused to flow from the first node 122 (FIG. 1) of the capacitance element 120 through transistor M2 220 to ground 235, negatively charging the capacitance element 120.

Figure 5:
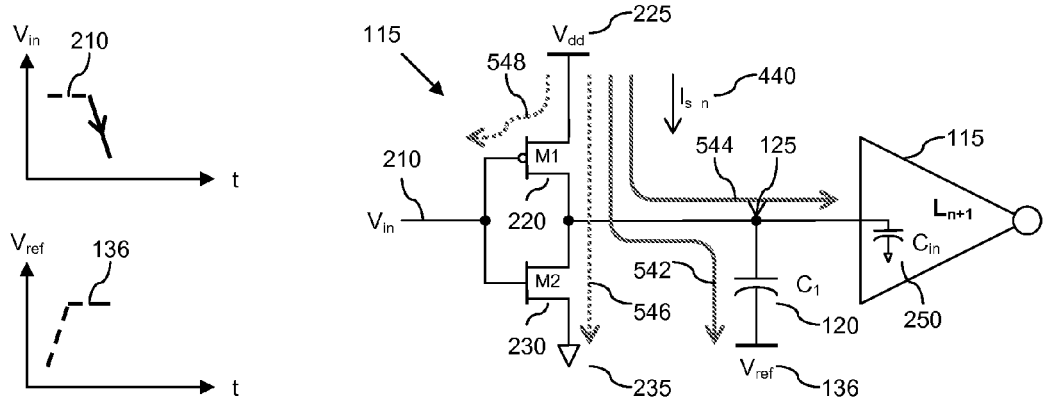

Referring next to FIG. 5, when the oscillating input signal 210 subsequently switches from a high voltage level to a low voltage level, the first transistor M1 220 'closes', operably coupling the output 125 to the first voltage supply signal 225, whilst the second transistor M2 230 'opens', substantially isolating the output 125 from the second voltage supply signal 235. In this manner, when the oscillating input signal 210 switches from a high voltage level to a low voltage level in this second mode of operation, the first node 122 (FIG. 1) of the capacitance element 120 is operably coupled to the first voltage supply signal 225. As such, the potential difference across the capacitance element 120 returns to substantially zero, and current 542 flows from the first voltage supply 225 into the first node 122 of the capacitance element 120, discharging (or negatively discharging) the capacitance element 120. A current 544 also flows from the first voltage supply signal 225 to the input capacitance 250 of the next inverter stage 115 in the oscillator ring 110. In addition, some mid-switching short circuit and leakage current will occur through the transistors 220, 230, illustrated at 546, 548. Thus, a supply current 440 from the first voltage supply signal 220 will comprise a combination of these charging and leakage currents 542, 544, 546, 548.

Figure 6:
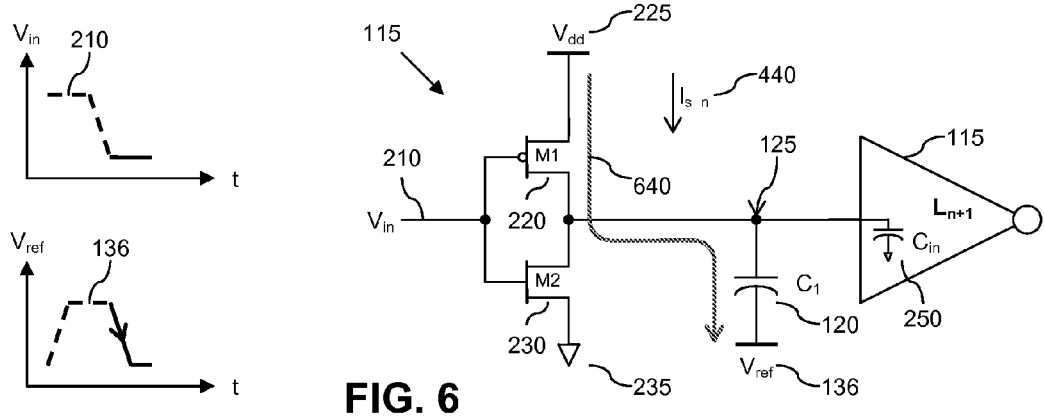

Referring now to FIG. 6, when the oscillating reference signal 135 subsequently switches from a high voltage level to a low voltage level, the potential difference across the capacitance element 120 changes from being substantially zero to being positive (i.e. the second node 124 (FIG. 1) of the capacitance element 120 comprising a lower voltage level than the first node 122 (FIG. 1) due to the low voltage level of the reference voltage 135). Accordingly, a current 640 is caused to flow to the first node 122 (FIG. 1) of the capacitance element 120 through transistor M1 220 from the first voltage supply signal 235, positively charging the capacitance element 120. Thus, the capacitance element 120 is charged for a second time in a single oscillating cycle of the ring oscillator 110 when the capacitance measurement module 105 is operating in this second mode.

Figure 7:
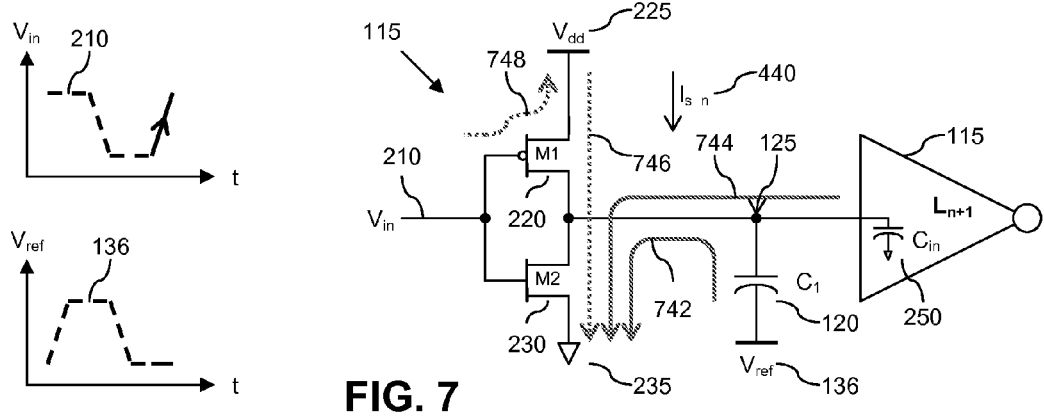

Referring next to FIG. 7, when the oscillating input signal 210 subsequently switches from a low voltage level to a high voltage level, the first transistor M1 220 'opens', substantially isolating the output 125 from the first voltage supply signal 225, whilst the second transistor M2 230 'closes', operably coupling the output 125 to the second voltage supply signal 235. In this manner, when the oscillating input signal 210 switches from a low voltage level to a high voltage level in this second mode of operation, the first node 122 (FIG. 1) of the capacitance element 120 is operably coupled to the second voltage supply signal 235, which in the illustrated example comprises ground. As such, the potential difference across the capacitance element 120 returns to substantially zero, and current 742 flows from the first node 122 of the capacitance element 120 to ground, discharging the capacitance element 120. A current 744 also flows from the input capacitance 250 of the next inverter stage 115 in the oscillator ring 110 to ground. In addition, some mid-switching short circuit and leakage current will occur through the transistors 220, 230, illustrated at 746, 748.

In this manner, when operating in this second mode, the on-die capacitance measurement module 105 is arranged to cyclically charge and discharge the capacitance element 210 twice during each oscillating cycle of the ring oscillator 110 by virtue of using as a reference signal for the second node 124 of the capacitance element 120, the oscillating reference signal 135 comprising a phase offset relative to the oscillating signal provided to the first node 122 of the capacitance element 120. Significantly, the supply current 440 to the inverter stage 115 during this second operating mode comprises a charging current for charging the capacitance element 120 twice, as well as a charging current for charging the input capacitance 250 of the next inverter stage 115, as well as the mid-switching short circuit currents during switching and the various leakage currents.

In order to optimize the phase difference between the oscillating signals provided to the capacitance element 120 in the second mode of operation, the oscillating signal output by the inverter stage 115 to which the capacitance element 120 is operably coupled and the reference oscillating signal 135 may comprise substantially converse phases. For example, the reference signal 135 may come from an inverter stage 115 which is an even number of stages behind the inverter stage 115 to which the capacitance element 120 is operably coupled (which would also be an odd number of stages ahead in the oscillator ring 110), such that the number should be close to half of the total number of stages in the oscillator ring 110.

For example, where the ring oscillator 110 comprises x stages, x being an odd integer value, and the oscillating voltage signal received by the first node 122 of the capacitance element 120 is output from a first inverter stage 115 within the ring oscillator 110 (note: such a 'first' inverter stage may be located at any point within the oscillator ring 110), and the reference oscillating voltage signal 135 is output from a stage located y stages behind the first stage within the ring oscillator, y being equal to (x±1)/2. Thus, in the case of an oscillator ring 110 comprising, say, thirteen stages, the reference oscillating voltage signal 135 may be output from an inverter stage located, for example, six stages behind the first stage within the oscillator ring 110 to which the capacitance element is operably coupled.

The virtual capacitances for each operating mode (i.e. the combined capacitances for the complete circuit, including all parasitic currents flowing in the circuit such as the input capacitance 250 of the next inverter stage 115) may be expressed as follows:

$$C_0 = \frac{I_{a0}}{f_0 \cdot Vdd} \quad \text{Eq. 1}$$

$$C_1 = \frac{I_{a1}}{f_1 \cdot Vdd} \quad \text{Eq. 2}$$

where $C_0$ is the virtual capacitance during the first operating mode, $C_1$ is the virtual capacitance during the second operating mode, $I_{a0}$ and $I_{a1}$ are the average supply currents 240, 440 during the first and second operating modes respectively after deducting leakage offset, $f_0$ and $f_1$ are the oscillating frequencies for the ring oscillator during the first and second operating modes respectively, and Vdd is the voltage level of the first voltage supply signal 225 (relative to the second voltage supply signal 235).

As described above, the capacitance element 120 is charged twice by the supply current 440 during a single oscillating cycle of the ring oscillator during the second mode of operation. As such, the delta between the average supply currents $I_{a0}$ and $I_{a1}$ will be the current required to charge the capacitance element 120. Thus, the capacitance C for the capacitance element 120 may be calculated as:

$$C = C_1 - C_0 = \frac{I_{a1} \cdot f_0 - I_{a0} \cdot f_1}{Vdd \cdot f_0 \cdot f_1} \quad \text{Eq. 3}$$

In each mode of operation, the supply current may be measured directly, for example by way of an automated test equipment (ATE) parametric measurement unit (PMU). Notably, a PMU is a standard component for ATEs, and is typically capable of measuring currents down to 100 nA with reasonable accuracy; more than three orders of magnitude less accurate than a Parametric Analyzer. The oscillating frequency of the ring oscillator 110 will vary slightly between the two operating modes due to the different virtual capacitances being charged. As such, the oscillating frequency for each mode of operation may be measured indirectly, for example using a time window signal 155 (FIG. 1) generated by an ATE unit (not shown) and an integrated counter 150 implemented within the integrated circuit device 100, and arranged operably coupled to an output of one of the inverter stages 115 such that the counter receives an oscillating signal output thereby. In this manner, the counter 150 may count the ring oscillator pulses within a time window during each mode of operation, as indicated by the time window signal. The resulting count may then be divided by the time window length to provide the oscillating frequency for the respective mode of operation.

The capacitive load to be measured may be duplicated for greater accuracy in case of very low capacitance values. For example, and as illustrated in FIG. 1, a plurality of capacitance elements 120, each representative of the capacitive load to be measured, may be implemented within the on-die capacitance measurement module 105; each capacitance element 120, 125 operably coupled between an output of an inverter stage 115 of the ring oscillator 110 and a reference voltage component 130. Placing a capacitance element 120 on more than one inverter stage output in this manner increases the ratio of the measured capacitance vs. parasitic (and virtual) capacitances, and measuring the combined average supply currents $I_s$ for the inverter stages, illustrated at $I_s$ 140 in FIG. 1, increases the accuracy of the measurement.

By way of example, in a simulation of such an on-die capacitance measurement module 105 comprising a ring oscillator comprising thirteen inverter stages 115, thirteen 12 fF capacitance elements 120 were operably coupled between the outputs of the thirteen inverter stages 115 and respective reference voltage components 130. During a first mode of operation in which a supply voltage Vdd of 1V was provided to the inverter stages 115, a combined average supply current $I_{a0}$ for the thirteen inverter stages 115 was measured at 347.6 uA, with a measured oscillating frequency $f_0$ of 1.583 GHz. During a second mode of operation in which the same supply voltage Vdd of 1V was provided to the inverter stages 115, a combined average supply current $I_{a1}$ for the thirteen inverter stages 115 was measured at 604.76 uA, with a measured oscillating frequency $f_1$ of 1.60767 GHz. Applying these values to Equation 3 above gives an average capacitance value C for each of the thirteen capacitance elements 210 of 12.045 fF Significantly, in order to be able to obtain similar measurements for such small capacitance values using prior art techniques required current measurements to be in the nano-amp range. As such, standard ATE could not be used to obtain very accurate measurements. In contrast, the example illustrated and described herein enables simple implementation and measurement of on-die capacitances as small as in the atto-Farad range using standard ATE, and without the need for a Parametric Analyzer for low current measurement. In this manner, a simple and accurate technique is provided for measuring capacitances for fabrication process characterisation purposes or for sensor/control applications.

Moreover, prior art techniques typically required special clock generation and complex clock alignment and clock shaping circuitry. By contrast, the example illustrated and described herein utilises a simple ring oscillator circuit, requiring no external clock source.

Figure 8:
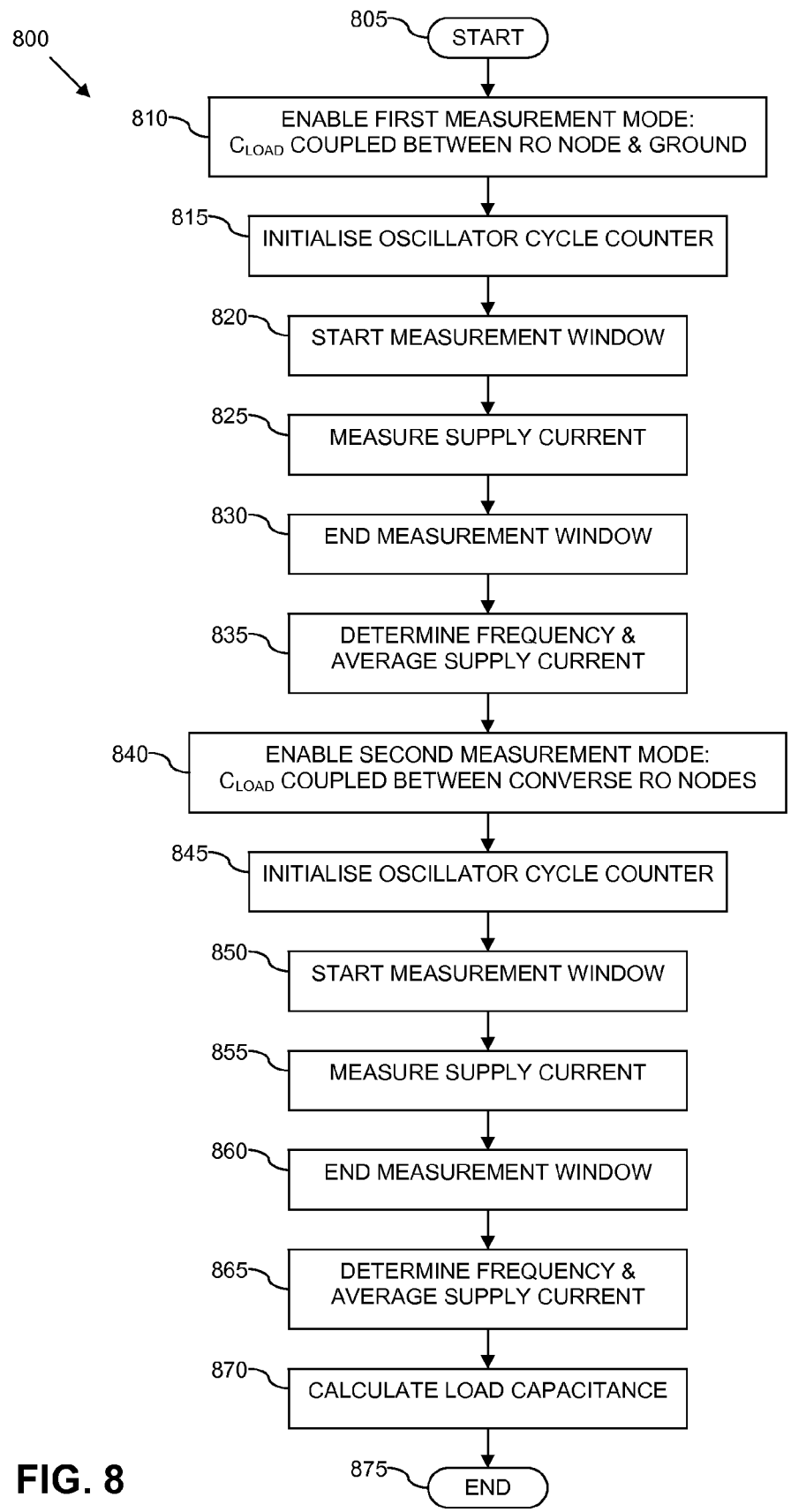
FIG. 8 illustrates a simplified flowchart 800 of an example of a method of measuring an on-die capacitive load.

Referring now to FIG. 8, there is illustrated a simplified flowchart 800 of an example of a method of measuring an on-die capacitive load, such as may be implemented at least partly by way of, for example, computer program code executing within automated test equipment or the like, and operating in conjunction with one or more on-die capacitance measurement module, such as the on-die capacitance measurement module illustrated in FIG. 1.

The method starts at 805, and moves on to 810 where a first measurement mode of the (at least one) on-die capacitance measurement module is enabled in which a first oscillating voltage signal output by an oscillating voltage supply component is applied to a first node of a capacitive element representative of the on-die capacitive load to be measured, and a constant reference voltage is applied to a second node of the at least one capacitive element. Thus, in the illustrated example, the capacitive element is operably coupled between a node 125 of the ring oscillator 110 and ground. Next, at 815, an oscillation counter is initialised to enable the oscillating frequency in the first measurement mode of the on-die capacitance measurement module to be measured and/or calculated. A measurement window is then started at 820, and the supply current for the oscillating voltage supply component is measured during the measurement window at 825. The measurement window ends at 830, and an oscillating frequency and average supply current are then determined for the first measurement mode of the on-die capacitance measurement module at 835. For example, the oscillating frequency may be determined based on the number of oscillations counted by the oscillation counter within the measurement window.

The method then moves on to 840, where a second measurement mode of the (at least one) on-die capacitance measurement module is enabled in which the first oscillating voltage signal output by the oscillating voltage supply component is applied to the first node of the capacitive element, and a second oscillating voltage signal output by the oscillating voltage supply component is applied to the second node of the capacitive element. Thus, in the illustrated example, the capacitive element is operably coupled between a two different nodes of the ring oscillator, and in particular in the illustrated example between substantially converse nodes within the ring oscillator. Next, at 845, the oscillation counter is re-initialised to enable the oscillating frequency in the second measurement mode of the on-die capacitance measurement module to be measured and/or calculated. A measurement window is then started at 850, and the supply current for the oscillating voltage supply component is measured during the measurement window at 855. The measurement window ends at 860, and an oscillating frequency and average supply current are then determined for the second measurement mode of the on-die capacitance measurement module at 865. For example, the oscillating frequency may be determined based on the number of oscillations counted by the oscillation counter within the measurement window. A capacitance value for the (at least one) capacitive element, and thus for the capacitive load of which the (at least one) capacitive element is representative, is then calculated at 870, and the method ends at 875.

At least parts of the invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

As used herein, the expression non-transitory will be understood to refer to the non-ephemeral nature of the storage medium itself rather than to a notion of how long the stored information itself may persist in a stored state. Accordingly, memories that might otherwise be viewed, for example, as being volatile (such as many electronically-erasable programmable read-only memories (EPROM's) or random-access memories (RAM's)) are nevertheless to be viewed here as being 'non-transitory' whereas a signal carrier in transit is to be considered 'transitory' notwithstanding that the signal may remain in transit for a lengthy period of time.

In the foregoing specification, the invention has been described with reference to specific examples of embodiments of the invention. It will, however, be evident that various modifications and changes may be made therein without departing from the broader spirit and scope of the invention as set forth in the appended claims, and that accordingly these are not limited to the examples described.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An on-die capacitance measurement module arranged to enable measurement of at least one capacitance element; the on-die capacitance measurement module comprising:

at least one oscillating voltage supply component arranged to output a first oscillating voltage signal and at least one further oscillating voltage signal, the first and at least one further oscillating voltage signals comprising differing phases, and the at least one oscillating voltage supply component being operably coupled to a first node of the at least one capacitance element and arranged to provide thereto the first oscillating voltage signal; and at least one reference voltage component operably coupled to a second node of the at least one capacitance element and arranged to provide thereto a reference voltage signal;

wherein the on-die capacitance measurement module is arranged to operate in a first mode, wherein the at least one reference voltage component is arranged to provide a constant reference voltage to the second node of the at least one capacitance element, and to operate in at least one further mode, wherein the at least one reference voltage component is arranged to provide a reference voltage signal representative of the at least one further oscillating voltage signal output by the at least one oscillating voltage supply component to the second node of the at least one capacitance element.

2. The capacitance measurement module of claim 1 wherein the first and at least one further oscillating voltage signals comprise converse phases.

3. The capacitance measurement module of claim 1 wherein the at least one oscillating voltage supply component comprises a ring oscillator.

4. The capacitance measurement module of claim 3 wherein the ring oscillator of the at least one oscillating voltage supply component comprises x stages, x being an odd integer value, and the first oscillating voltage signal is output from a first stage within the ring oscillator, and the at least one further oscillating voltage signal is output from a stage located y stages behind the first stage within the ring oscillator, y being equal to (x±1)/2.

5. The capacitance measurement module of claim 1 wherein the at least one reference voltage component comprises logic arranged to receive at a first input thereof the at least one further oscillating voltage signal, and at a second input thereof a mode select signal, and to output the reference voltage signal to the second node of the at least one capacitance element.

6. The capacitance measurement module of claim 1 wherein the capacitance measurement module further comprises a counter arranged to receive an oscillating voltage signal from the at least one oscillating voltage supply component, and to count a number of oscillations within the received oscillating voltage signal.

7. The capacitance measurement module of claim 1 implemented as an integrated circuit device comprising at least one die in a single package.

8. A method of measuring an on-die capacitive load, the method comprising, within an on-die capacitance measurement module:

configuring a first oscillating voltage signal output by at least one oscillating voltage supply component to be applied to a first node of at least one capacitive element representative of the on-die capacitive load to be measured, and a constant reference voltage to be applied to a second node of the at least one capacitive element, to enable a first operating mode of the on-die capacitance measurement module; and measuring a supply current for the at least one oscillating voltage supply component for the first operating mode;

wherein the method further comprises, within the on-die capacitance measurement module:

configuring the first oscillating voltage signal output by the at least one oscillating voltage supply component to be applied to the first node of at least one capacitive element, and a second oscillating voltage signal output by the at least one oscillating voltage supply component to be applied to the second node of the at least one capacitance element, to enable a second operating mode of the on-die capacitance measurement module; and measuring a supply current for the at least one oscillating voltage supply in the second operating mode of the on-die capacitance measurement module.

9. The method of claim 8 wherein the first and second oscillating voltage signals comprise converse phases.

10. The method of claim 8 wherein the method further comprises calculating a capacitance value for the at least one capacitive element based at least partly on average current values for the measured supply currents for the at least one oscillating voltage supply in the first and second operating modes.

11. The method of claim 10 wherein the method further comprises measuring an oscillating frequency of the first oscillating voltage signal in the first operating mode of the on-die capacitance measurement module and an oscillating frequency of the second operating mode of the on-die capacitance measurement module; and calculating a capacitance value for the at least one capacitive element based at least partly on the measure oscillating frequencies of the first oscillating voltage signal in the first and second operating modes of the on-die capacitance measurement module.

12. The method of claim 11 wherein the method comprises counting oscillation pulses for the at least one oscillating voltage supply component within a time window during each operating mode of the on-die capacitance measurement module, and calculating an oscillating frequency for each operating mode of the on-die capacitance measurement module based at least partly on the respective oscillation pulse count.

13. A tangible non-transitory computer program product having executable program code stored therein for programming signal processing logic to perform a method of measuring an on-die capacitive load, the code operable for:

configuring a first oscillating voltage signal output by at least one oscillating voltage supply component to be applied to a first node of at least one capacitive element representative of the on-die capacitive load to be measured, and a constant reference voltage to be applied to a second node of the at least one capacitive element, to enable a first operating mode of the on-die capacitance measurement module; and measuring a supply current for the at least one oscillating voltage supply component for the first operating mode;

wherein the method further comprises, within the on-die capacitance measurement module:

configuring the first oscillating voltage signal output by the at least one oscillating voltage supply component to be applied to the first node of at least one capacitive element, and a second oscillating voltage signal output by the at least one oscillating voltage supply component to be applied to the second node of the at least one capacitance element, to enable a second operating mode of the on-die capacitance measurement module; and measuring a supply current for the at least one oscillating voltage supply in the second operating mode of the on-die capacitance measurement module.

14. The non-transitory computer program product of claim 13 wherein the computer readable storage medium comprises at least one of: a hard disk, a CD-ROM, an optical storage device, a magnetic storage device, a Read Only Memory, ROM, a Programmable Read Only Memory, PROM, an Erasable Programmable Read Only Memory, EPROM, an Electrically Erasable Programmable Read Only Memory, EEPROM, and a Flash memory.

* * * * *